United States Patent [19]

Tokuda et al.

[11] Patent Number: 5,691,806
[45] Date of Patent: Nov. 25, 1997

[54] PROJECTION EXPOSURE APPARATUS CONTAINING AN ENCLOSED HOLLOW STRUCTURE

[75] Inventors: Yukio Tokuda, Kawasaki; Yukio Takabayashi, Utsunomiya, both of Japan

[73] Assignee: Canon Kabushiki Kaisha, Tokyo, Japan

[21] Appl. No.: 531,344

[22] Filed: Sep. 20, 1995

[30] Foreign Application Priority Data

Oct. 6, 1994 [JP] Japan .................. 6-268418

[51] Int. Cl.⁶ .................................................. G03B 27/58
[52] U.S. Cl. ........................................... 355/72; 355/53
[58] Field of Search .............................. 355/18–71, 72; 248/638, 568

[56] References Cited

U.S. PATENT DOCUMENTS

| | | | |
|---|---|---|---|
| 4,724,466 | 2/1988 | Ogawa et al. | 355/53 |
| 5,187,519 | 2/1993 | Takabayashi et al. | 355/53 |
| 5,285,995 | 2/1994 | Gonzalez et al. | 248/550 |
| 5,334,434 | 8/1994 | Shiota et al. | 428/188 |
| 5,446,519 | 8/1995 | Makinouchi | 355/53 |

*Primary Examiner*—R. L. Moses
*Assistant Examiner*—Shival P. Virmani
*Attorney, Agent, or Firm*—Fitzpatrick, Cella, Harper & Scinto

[57] ABSTRACT

A projection lens, a reticle stage and a light source optical system are supported by a cast frame above a wafer stage for holding a wafer thereon. A top portion of the cast frame has an enclosed hollow structure in which strengthening ribs are built, thereby substantially increasing the rigidity of the top portion. Since the ribs are built in the top portion of the cast frame, the surface area exposed to the wafer stage is reduced. As a result, there is little chance that the wafer is contaminated by any adherents to the cast frame.

23 Claims, 2 Drawing Sheets

FIG. I

PROJECTION EXPOSURE APPARATUS CONTAINING AN ENCLOSED HOLLOW STRUCTURE

BACKGROUND OF THE INVENTION

1. Field of the Invention

The present invention relates to a projection exposure apparatus for exposing a substrate, such as a semiconductor wafer, to produce a semiconductor device, a microelectronic device and the like.

2. Description of the Related Art

A well-known type of projection exposure apparatus used to produce semiconductor devices and the like comprises, as shown in FIG. 2, a wafer stage 101 for positioning a wafer $W_0$ thereon, a projection lens 102 located above the wafer stage 101, a reticle stage 103 and a light source optical system 104. Exposure light emitted from the light source optical system 104 passes through a reticle $R_0$ laid on the reticle stage 103 and is condensed onto the wafer $W_0$ by the projection lens 102, thereby transferring a pattern of the reticle $R_0$ onto the wafer $W_0$.

The wafer stage 101 is supported in the center of a base 101a, which is supported on the floor through a vibration isolator 101b. A cast frame 105 is supported in a standing position on the outer periphery of the base 101a. A top portion 105a of the cast frame 105 supports the projection lens 102 in the center thereof, and supports a reticle stage support member 103a for supporting the reticle stage 103 and a light source optical system support member 104a for supporting the light source optical system 104 in an upright position around the projection lens 102.

The cast frame 105 thus supporting the projection lens 102, the reticle stage 103 and the light source optical system 104 is required to have high rigidity. In particular, the heavy projection lens 102 is supported in the center of the top portion 105a of the cast frame 105, and the rigidity of the top portion 105a needs to be increased substantially to stably support the projection lens 102. Conventionally, as shown in a cutaway portion of FIG. 2, a rib structure, in which a plurality of ribs 105b project down from the bottom of the top portion 105a, is generally adopted in the top portion 105a to increase the rigidity thereof.

However, according to the above-mentioned conventional art, a plurality of ribs project down from the bottom of the top portion of the cast frame for supporting the projection lens, the reticle stage and the light source optical system as described above, and therefore, a wide cast surface is exposed onto the wafer stage. In this case, dust adhering to the cast surface is likely to fall onto a wafer laid on the wafer stage and to make the surface of the wafer dirty, which causes the failure of a transfer pattern. As a result, the yield of products decreases sharply, and this problem has not yet been solved.

Furthermore, a projection lens and a reticle stage have recently been increased in size and weight with the increase in the diameter of a wafer. Therefore, a cast frame for supporting the projection lens and the reticle stage is required to have an even higher rigidity.

In addition, since transfer patterns have been made finer, vibration isolation is important to prevent vibrations generated from a pulse motor of a wafer stage or the like and the driver of an air conditioner from being transmitted to the reticle stage and the projection lens through the cast frame.

SUMMARY OF THE INVENTION

In view of the above-described unsolved problems of the prior art, the present invention seeks to provide a projection exposure apparatus which can substantially improve rigidity and vibration isolation properties of a support member, such as a cast frame, for supporting a projection optical system and reduce contamination of a substrate, such as a wafer, due to adherence of contaminants on the support member.

In order to achieve the above object, the present invention provides a projection exposure apparatus comprising a support member for supporting a projection optical system, which projects a pattern of an original onto a substrate, and a substrate stage for holding a substrate to be exposed through the projection optical system, wherein at least a predetermined portion of the support member facing the substrate stage has an enclosed hollow structure with at least one built-in strengthening rib.

Since the predetermined portion of the support member has an enclosed hollow structure in which one or more strengthening ribs are built, greater rigidity of the support member can be ensured than when ribs are exposed. In addition, contamination of the substrate due to adherence of contaminants to the support member can be prevented by substantially reducing the area of the support member exposed to the substrate stage.

If the enclosed hollow portion of the support member is filled with vibration absorbing material, vibrations transmitted from a driver of the substrate stage or the like to the support member can be attenuated promptly by the vibration absorbing material.

As a result, it is possible to achieve a projection exposure apparatus which has high precision and high productivity and readily copes with the increase in size of substrates and further precision of transfer patterns.

These and other objects, features and advantages of the present invention will become more apparent from the following description of the preferred embodiment taken in conjunction with the accompanying drawing.

BRIEF DESCRIPTION OF THE DRAWINGS

Like or corresponding reference numerals have been used for like or corresponding elements throughout the views.

DESCRIPTION OF THE PREFERRED EMBODIMENTS

A detailed description of a preferred embodiment of the present invention will now be given in conjunction with the accompanying drawing.

Figure 1:
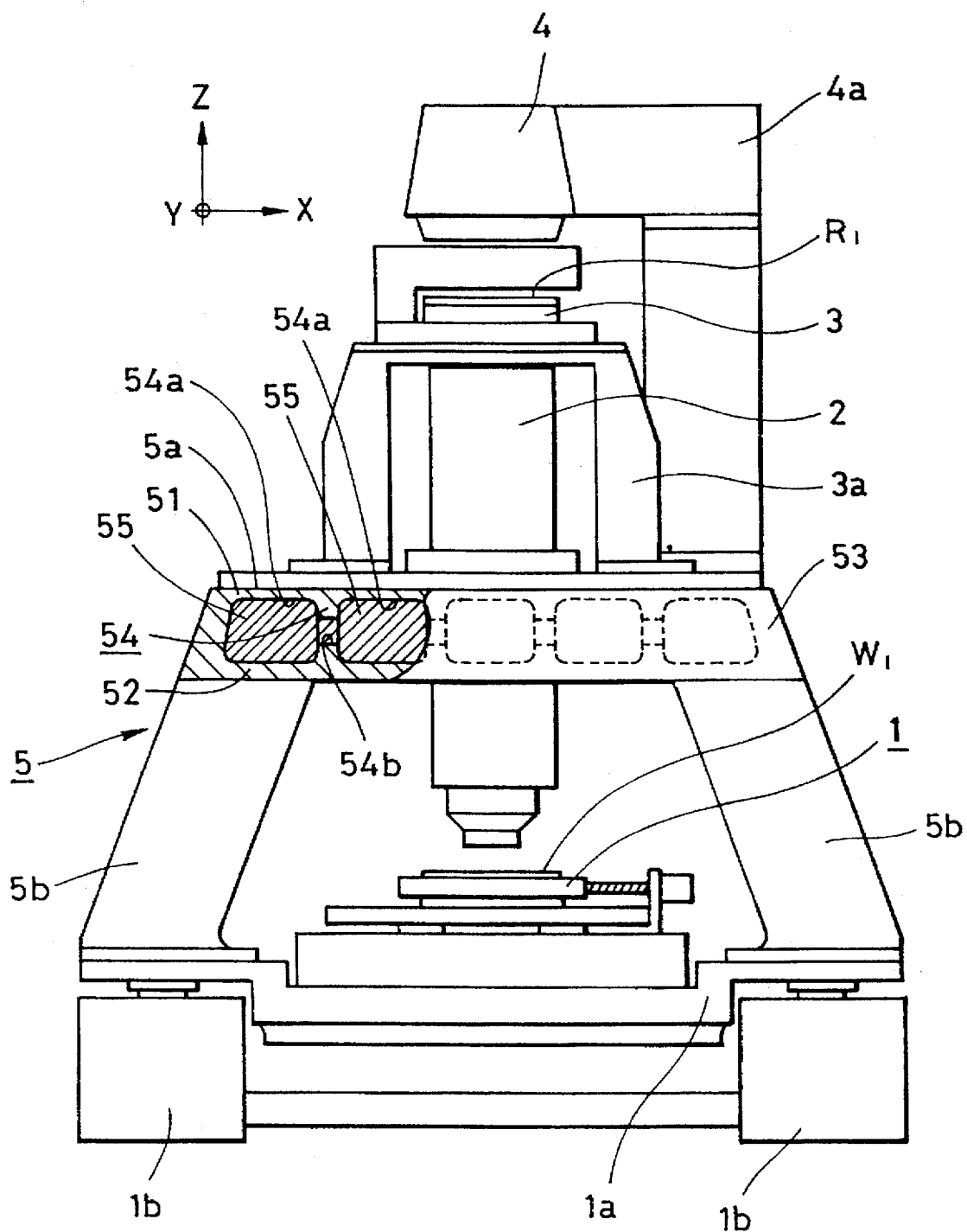
FIG. 1 is a partially cutaway elevation view of a projection exposure apparatus according to an embodiment of the present invention.
Figure 2:
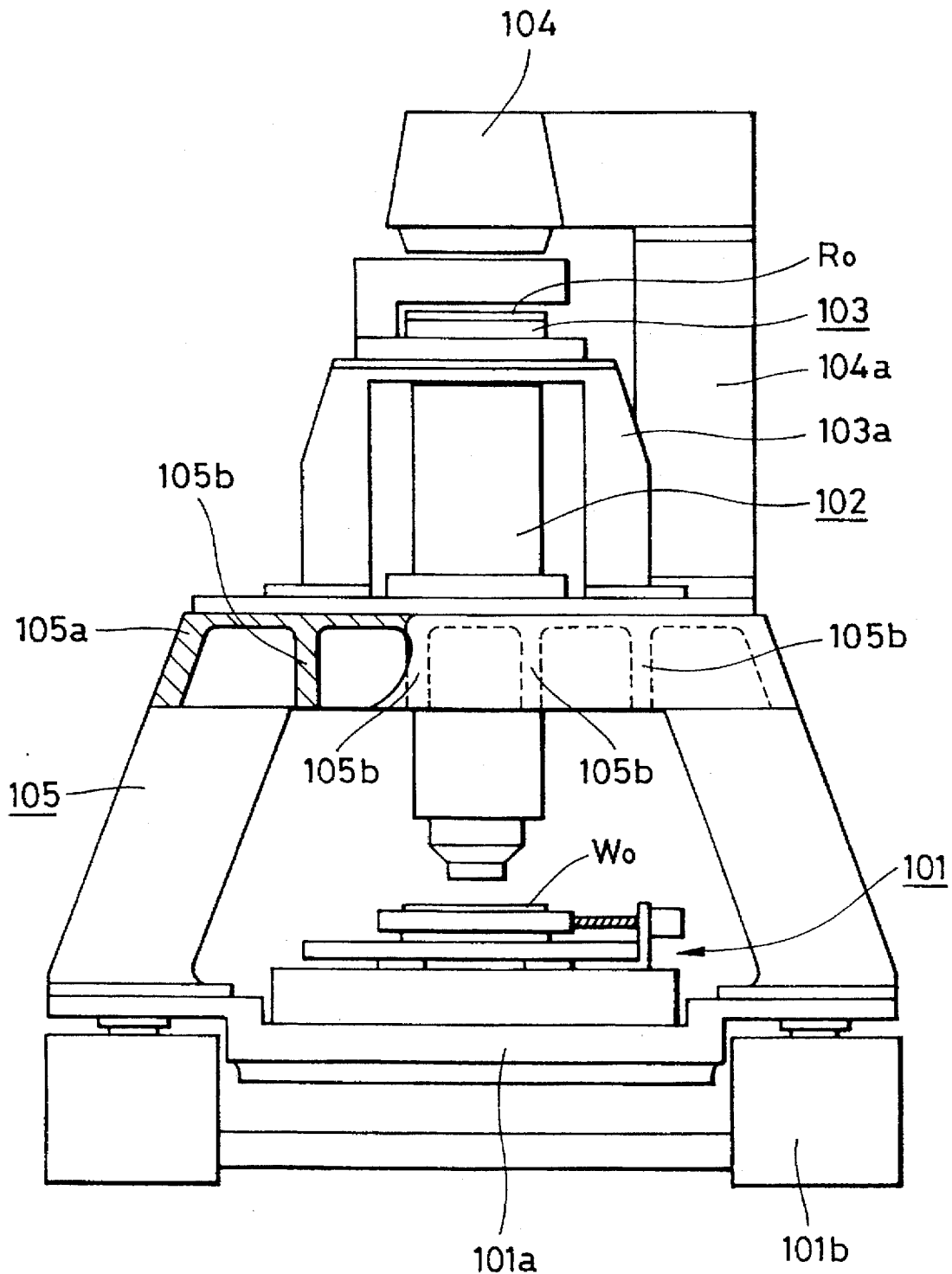
FIG. 2 is a partially cutaway elevation view of a conventional projection exposure apparatus.

FIG. 1 is a partially cutaway elevation view of a projection exposure apparatus according to an embodiment of the present invention. Referring to FIG. 1, the projection exposure apparatus comprises a wafer stage 1 as a well-known substrate stage which moves in the x and y directions to position a wafer $W_1$ as a substrate along an x–y plane, a projection lens 2 as a projection optical system located above the wafer stage 1, a reticle stage 3 as an original stage, and a light source optical system 4. Exposure light emitted from the light source optical system 4 passes through a reticle $R_1$ as an original laid on the reticle stage 3 and is condensed onto the wafer $W_1$ by the projection lens 2, thereby transferring a pattern of the reticle $R_1$ onto the wafer $W_1$.

The wafer stage 1 is supported in the center of a base 1a, which is supported on a floor, which is not shown, through a plurality of vibration isolators 1b. A cast frame 5 as a support, which is comprised of a top portion 5a having a hollow structure, as will be described below, and four leg portions 5b integrally formed with the top portion 5a (only two leg portions are shown in FIG. 1), is supported in a standing position on the outer periphery of the base 1a. The top portion 5a of the cast frame 5 supports the projection lens 2 in the center thereof, and supports a gate-shaped support member 3a for supporting the reticle stage 3 and an L-shaped support member 4a for supporting the light source optical system 4 in an upright position around the projection lens 2.

The hollow top portion 5a is, as shown in a partial cutaway portion, constituted by a pair of planar portions 51 and 52 opposed in the vertical direction (the direction of the optical axis of the projection lens 2), a side wall portion 53 integrally formed with the peripheral edges of the planar portions 51 and 52, and a plurality of strengthening ribs 54 crossing each other vertically and horizontally (in the x and y directions) along a horizontal plane (x–y plane) between the planar portions 51 and 52.

A sufficient number of ribs 54 to strengthen the top portion 5a are located to cross vertically and horizontally, by which a plurality of box-shaped hollow portions 54a are arranged in a lattice between the planar portions 51 and 52. Furthermore, each of the ribs 54 is provided with a hole 54b for communicating with the adjacent hollow portion 54a.

The top portion 5a having such a hollow structure may be molded in one piece by using a sand-molded core in casting the cast frame 5, or formed by combining a plate member to be the bottom planar portion 52 with a cast frame with a top portion having a rib structure by welding or the like.

A two-part urethane foam resin 55 as an example of a vibration absorbing material is injected from an unillustrated opening formed on the side wall portion 53 into the hollow portions 54a in the top portion 5a of the cast frame 5, to uniformly fill in all the hollow portions 54a through the holes 54b of the ribs 54.

The top portion 5a of the cast frame 5 is provided with a sufficient flexural rigidity to stably support the heavy projection lens 2 by the ribs 54. Furthermore, since the ribs 54 are put inside the hollow structure, the area of a cast surface exposed to a wafer $W_1$ laid on the wafer stage 1 is decreased, which reduces the chances of contamination of the wafer $W_1$ caused by falling of foreign substances from the cast surface.

In addition, a high-frequency vibration, for example, surface wave and compression wave vibrations, transmitted from the wafer stage 1 or an external driver to the cast frame 5 is attenuated promptly by the urethane foam resin filled in the hollow portions 54a in the top portion 5a of the cast frame 5. Therefore, the alignment accuracy of a well-known alignment optical system, which is not shown, the resolution of the projection lens and the like are not impaired by the aforesaid vibrations.

As described above, according to the present invention, since the top portion of the cast frame has a hollow structure and strengthening ribs are built in the top portion, it is possible to reduce trouble caused by adherence of contaminants to the cast surface and to increase substantially the yield of semiconductor products.

Furthermore, since the top portion of the cast frame has a hollow structure in which strengthening ribs are built, an even greater rigidity can be obtained than when the top portion is strengthened only by exposed ribs as in the prior art. Still further, the vibration isolating ability of the cast frame can be increased drastically by filling the hollow portions in the hollow structure with a vibration absorbing material such as urethane foam resin.

Accordingly, it is possible to achieve a projection exposure apparatus which can readily cope with the increase in size of wafers and further precision of transfer patterns.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A projection exposure apparatus, comprising:
   a projection optical system for projecting a pattern of an original onto a substrate;
   a substrate stage for holding the substrate thereon; and
   a support member, being arranged above said substrate stage, for supporting said projection optical system,
   wherein at least a portion of said support member facing said substrate stage has an enclosed hollow structure with at least one built-in strengthening rib.

2. A projection exposure apparatus according to claim 1, wherein the enclosed hollow structure of said support member is filled with a vibration absorbing material.

3. A projection exposure apparatus according to claim 2, wherein said vibration absorbing material comprises a foaming resin.

4. A projection exposure apparatus according to claim 2, further comprising an original stage for holding the original, wherein said support member supports said original stage.

5. A projection exposure apparatus according to claim 4, further comprising a light source optical system for illuminating the original to project the pattern of the original onto the substrate by exposure, wherein said support member supports said light source optical system.

6. A projection exposure apparatus according to claim 1, wherein said support member comprises a frame formed by casting.

7. A projection exposure apparatus according to claim 6, wherein the enclosed hollow structure of said support member is filled with a vibration absorbing material.

8. A projection exposure apparatus according to claim 7, wherein said vibration absorbing material comprises a foaming resin.

9. A projection exposure apparatus according to claim 7, further comprising an original stage for holding the original, wherein said support member supports said original stage.

10. A projection exposure apparatus according to claim 9, further comprising a light source optical system for illuminating the original to project the pattern of the original onto the substrate by exposure, wherein said support member supports said light source optical system.

11. A projection exposure apparatus, comprising:
    a projection optical system for projecting a pattern of an original onto a substrate;
    a substrate stage for holding the substrate thereon; and
    a support member for supporting said projection optical system,
    wherein at least a portion of said support member facing said substrate stage has an enclosed hollow structure with at least one built-in strengthening rib, the enclosed hollow structure being filled with a vibration absorbing material.

12. A projection exposure apparatus according to claim 11, wherein said vibration absorbing material comprises a foaming resin.

13. A projection exposure apparatus according to claim 11, further comprising an original stage for holding the original, wherein said support member supports said original stage.

14. A projection exposure apparatus according to claim 13, further comprising a light source optical system for illuminating the original to project the pattern of the original onto the substrate by exposure, wherein said support member supports said light source optical system.

15. A projection exposure apparatus, comprising:

a projection optical system for projecting a pattern of an original onto a substrate;

a substrate stage for holding the substrate thereon; and a support member, comprising a frame formed by casting, for supporting said projection optical system, wherein at least a portion of said support member facing said substrate stage has an enclosed hollow structure with at least one built-in strengthening rib.

16. A projection exposure apparatus according to claim 15, wherein the enclosed hollow structure of said support member is filled with a vibration absorbing material.

17. A projection exposure apparatus according to claim 16, wherein said vibration absorbing material comprises a foaming resin.

18. A projection exposure apparatus according to claim 16, further comprising an original stage for holding the original, wherein said support member supports said original stage.

19. A projection exposure apparatus according to claim 18, further comprising a light source optical system for illuminating the original to project the pattern of the original onto the substrate by exposure, wherein said support member supports said light source optical system.

20. A projection exposure apparatus, comprising:

a projection optical system for projecting a pattern of an original onto a substrate;

a substrate stage for holding the substrate thereon; and a support member, being arranged above said substrate stage, for supporting said projection optical system, said support member having a plurality of enclosed hollow portions, wherein at least a portion of said support member facing said substrate stage has an enclosed hollow structure with at least one built-in strengthening rib, said built-in strengthening rib comprising a path linking the enclosed hollow portions of said support member with each other.

21. A projection exposure apparatus according to claim 20, wherein said support member comprises a frame formed by casting.

22. A projection exposure apparatus according to claim 21, wherein the enclosed hollow structure of said support member is filled with a vibration absorbing material.

23. A projection exposure apparatus according to claim 22, wherein said vibration absorbing material comprises a foaming resin.

* * * * *